United States Patent
Choi

(10) Patent No.: US 8,750,063 B2
(45) Date of Patent: Jun. 10, 2014

(54) SENSE AMPLIFIER CONTROL CIRCUIT AND SEMICONDUCTOR MEMORY DEVICE INCLUDING THE SAME

(75) Inventor: Don Hyun Choi, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/602,258

(22) Filed: Sep. 3, 2012

(65) Prior Publication Data

US 2013/0315017 A1    Nov. 28, 2013

(30) Foreign Application Priority Data

May 25, 2012   (KR) .................. 10-2012-0056014

(51) Int. Cl.
*G11C 7/00*   (2006.01)

(52) U.S. Cl.
USPC ........ 365/205; 365/72; 365/203; 365/189.08; 365/230.03

(58) Field of Classification Search
USPC .................. 365/205, 203, 72, 230.03, 189.08
See application file for complete search history.

(56) References Cited

U.S. PATENT DOCUMENTS

| | | | |
|---|---|---|---|
| 6,532,186 B2 * | 3/2003 | Cha .......................... | 365/230.03 |
| 6,876,584 B2 * | 4/2005 | Kwon ......................... | 365/196 |
| 6,925,020 B2 * | 8/2005 | Kwon ......................... | 365/205 |
| 6,928,014 B2 * | 8/2005 | Jeong .......................... | 365/205 |
| 6,980,476 B2 * | 12/2005 | Do ............................... | 365/201 |
| 7,002,862 B2 * | 2/2006 | Kang .......................... | 365/205 |
| 7,020,043 B1 * | 3/2006 | Lee ......................... | 365/230.06 |
| 7,280,422 B2 * | 10/2007 | Kim et al. ................... | 365/203 |
| 7,336,553 B2 | 2/2008 | Reohr | |
| 7,499,350 B2 * | 3/2009 | Park .......................... | 365/196 |
| 7,505,343 B2 * | 3/2009 | Kang .......................... | 365/205 |
| 7,599,238 B2 * | 10/2009 | Cho ............................ | 365/205 |
| 7,782,647 B2 * | 8/2010 | Lee et al. .................... | 365/72 |
| 8,279,694 B2 * | 10/2012 | Hong et al. ................. | 365/205 |

FOREIGN PATENT DOCUMENTS

KR    1020090112297 A    10/2009

\* cited by examiner

*Primary Examiner* — Viet Q Nguyen
(74) *Attorney, Agent, or Firm* — William Park & Associates Patent Ltd.

(57) ABSTRACT

A sense amplifier control circuit according to the present invention is disposed in a bit line sense amplifier (BLSA) array region including a plurality of BLSAs and is configured to supply a precharge voltage to the plurality of BLSAs in response to a control signal.

12 Claims, 4 Drawing Sheets

SENSE AMPLIFIER CONTROL CIRCUIT AND SEMICONDUCTOR MEMORY DEVICE INCLUDING THE SAME

CROSS-REFERENCES TO RELATED APPLICATION

The present application claims priority under 35 U.S.C. §119(a) to Korean application number 10-2012-0056014, filed on May 25, 2012, in the Korean Intellectual Property Office, which is incorporated herein by reference in its entirety.

BACKGROUND

1. Technical Field

The present invention relates generally to a semiconductor integrated circuit, and more particularly to the sense amplifier control circuit of a semiconductor memory device.

2. Related Art

The data output operations of a semiconductor memory device are performed as follows in general. The cell data selected through a word line is amplified by a bit line sense amplifier (BLSA), and the amplified data is loaded onto a global input/output (GIO) line and outputted to an I/O terminal.

When the data from the cells that are connected to a selected word line is loaded onto a bit line pair (BL pair) comprised of a bit line BL and a bit bar line BLb, a sense amplifier enable signal (which signal is used to indicate the time at which the operation of the BLSA would start) is enabled, so as to drive a sense amplifier control circuit. Furthermore, the bias voltage of the BLSA shifts to a core voltage VCORE and a ground voltage VSS by the sense amplifier control circuit, so as to drive a sense amplifier latch. That is, when the sense amplifier latch starts operating, the voltages of the BL pair (BL and BLb) that used to maintain a minute voltage difference shift to the core voltage VCORE and the ground voltage VSS, respectively. The cell data amplified as described above is loaded onto the GIO line and is outputted to the I/O terminal.

FIG. 1 relates to a conventional semiconductor memory device.

FIG. 1 shows the structure of a conventional semiconductor memory device.

The known semiconductor memory device as shown in FIG. 1 includes a plurality of cell arrays 10~15, a plurality of sub-word line driver (SWD) arrays 20~23, a plurality of BLSA arrays 30~32, and a plurality of sub-holes 40 and 41.

The plurality of sub-holes 40 and 41 includes respective sense amplifier control circuits 40~1 and 41~1.

The plurality of BLSA arrays 30~32 includes a plurality of BLSAs 50~58.

Each of the plurality of cell arrays 10~15 includes a plurality of cells for storing data. Each pair of cell arrays (e.g., placed vertically in FIG. 1) among the cell arrays 10~15, share one of the BLSA arrays 30~32 (e.g., horizontally disposed in FIG. 1). Each of the BLSA arrays 30~32 includes a plurality of the BLSAs to amplify a minute voltage difference between the bit line BL and the bit bar line BLb. Furthermore, the regions of cell arrays placed horizontally, from among the cell arrays 10~15, share one of the SWD arrays 20~23 vertically disposed. The SWD arrays 20~23 include a plurality of word line drivers to selectively drive the plurality of cell arrays 10~15 when an address is received.

The sense amplifier control circuits 40~1 and 41~1 are placed in the respective sub-holes 40 and 41.

The sub-holes are placed in the respective regions where the BLSA arrays horizontally disposed between upper and lower cell arrays cross SWD arrays vertically disposed between left and right cell arrays. That is, the sub-hole refers to a space unoccupied after the BLSA arrays and the SWD arrays are placed in the X-axis and Y-axis directions. The sub-hole includes the sense amplifier control circuit to supply voltage to the BLSAs to amplify the voltage difference.

The area of a cell array region will need to increase in order to increase the yield of semiconductor memory devices. Then, the resulting lengths of the lines to couple the BLSAs in the BLSA array and the sense amplifier control circuit in the sub-hole will also have to increase. The BLSA array region would relatively increase in the X-axis direction in proportion to the increase of the cell array region. Since the BLSAs and the sense amplifier control circuit to supply voltage to the BLSAs are separately placed in the BLSA array region and the sub-hole region, the length of connection between the BLSAs and the sense amplifier control circuit increases depending on the positions of the BLSAs. The voltage supplied from the sense amplifier control circuit results in a noise and a consequent problem of a reduction in the operation margin of the BLSA caused by the noise in the voltage supplied from the sense amplifier control circuit.

SUMMARY

In an embodiment of the present invention, a sense amplifier control circuit is disposed in a BLSA array region including a plurality of BLSAs and configured to supply a precharge voltage to the plurality of BLSAs in response to a control signal.

In an embodiment of the present invention, a semiconductor memory device includes: a BLSA array configured to comprise one or more first sense amplifier control circuits to supply a precharge voltage to a plurality of BLSAs in response to a control signal; and a sub-hole configured to comprise a second sense amplifier control circuit to supply the plurality of BLSAs with the precharge voltage, a sense amplifier power voltage of a core voltage level, and a sense amplifier ground voltage of a ground voltage level in response to the control signal and first and second power source supply signals.

BRIEF DESCRIPTION OF THE DRAWINGS

Features, aspects, and embodiments are described in conjunction with the attached drawings, in which.

DETAILED DESCRIPTION

Hereinafter, a sense amplifier control circuit and a semiconductor memory device including the same according to an embodiment of the present invention are described below with reference to the accompanying drawings through various embodiments.

Figure 2:
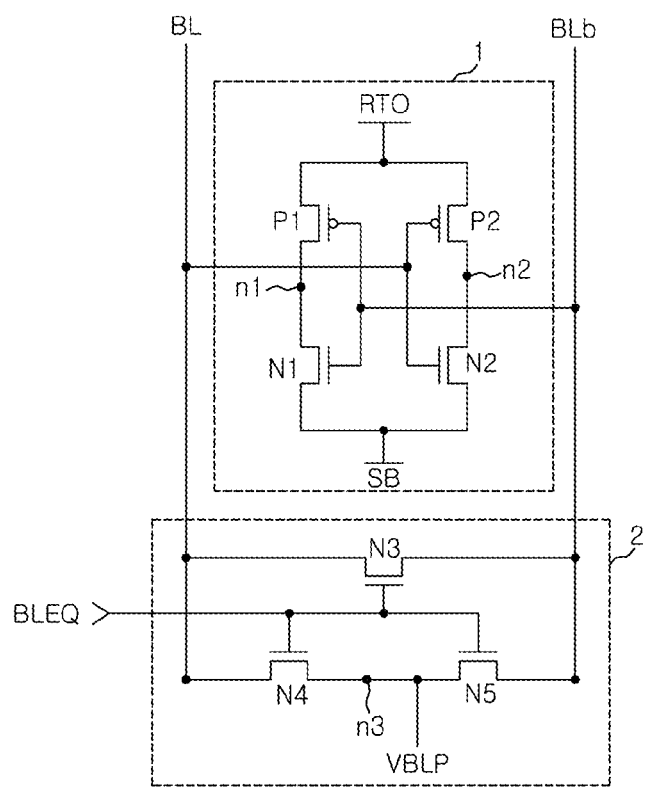
FIG. 2 is a circuit diagram of a BLSA.

The circuit diagram of a BLSA is described below with reference to FIG. 2.

The BLSA includes a sense amplifier latch unit 1 and an equalization unit 2. The sense amplifier latch unit 1 includes a first PMOS transistor P1 connected between a sense amplifier power voltage RTO and a first node n1 and configured to receive the output of a bit bar line BLb, a second PMOS transistor P2 connected between the sense amplifier power voltage RTO and a second node n2 and configured to receive the output of a bit line BL, a first NMOS transistor N1 connected between the first node n1 and a sense amplifier ground voltage SB and configured to receive the output of the bit bar line BLb, and a second NMOS transistor N2 connected between the second node n2 and the sense amplifier ground voltage SB and configured to receive the output of the bit line BL.

The equalization unit 2 includes a third NMOS transistor N3 connected between the bit line BL and the bit bar line BLb and configured to receive a bit line equalization signal BLEQ, a fourth NMOS transistor N4 connected between the bit line BL and a third node n3 and configured to receive the bit line equalization signal BLEQ, and a fifth NMOS transistor N5 connected between the third node n3 and the bit bar line BLb and configured to receive the bit line equalization signal BLEQ.

The operation of the BLSA is described below with reference to FIG. 2.

When data stored in a memory cell is loaded onto the bit line BL and the bit bar line BLb, charge sharing occurs between the bit line BL and the bit bar line BLb, and thus a voltage difference occurs between the bit line BL and the bit bar line BLb.

When charge sharing occurs between the bit line BL and the bit bar line BLb, the BLSA starts an active operation, and the bit line equalization signal BLEQ that has shifted to a low level by a signal internally generated in response to an external command is supplied to the equalization unit 2.

Before the BLSA starts the active operation, the bit line equalization signal BLEQ of a high level is supplied to the equalization unit 2.

The equalization unit 2 turns on the third to fifth NMOS transistors N3, N4, N5 in response to the bit line equalization signal BLEQ of a high level so that the bit line BL and the bit bar line BLb maintain a precharge voltage VBLP. The sense amplifier power voltage RTO and the sense amplifier ground voltage SB are supplied to the sense amplifier latch unit 1 as the precharge voltage VBLP, and thus the sense amplifier latch unit 1 maintains a latch state.

When the BLSA starts the active operation, the bit line equalization signal BLEQ of a low level is supplied to the equalization unit 2, which turns off the third to fifth NMOS transistors N3, N4, N5 in response to the bit line equalization signal BLEQ of a low level so that the bit line BL and the bit bar line BLb have a voltage difference. The sense amplifier power voltage RTO supplied to the sense amplifier latch unit 1 shifts to a level substantially equal to a core voltage VCORE, and the sense amplifier ground voltage SB shifts to a level substantially equal to a ground voltage VSS. When the active operation is started, the sense amplifier latch unit 1 performs an operation to amplify a voltage difference between the bit line BL and the bit bar line BLb.

In general, the precharge voltage VBLP is substantially half the core voltage VCORE. When a voltage difference is present between the bit line BL and the bit bar line BLb due to charge sharing, the BLSA amplifies the voltage difference so that the voltages of the bit line BL and the bit bar line BLb shift to respective levels substantially equal to the core voltage VCORE and the ground voltage VSS.

Figure 3:
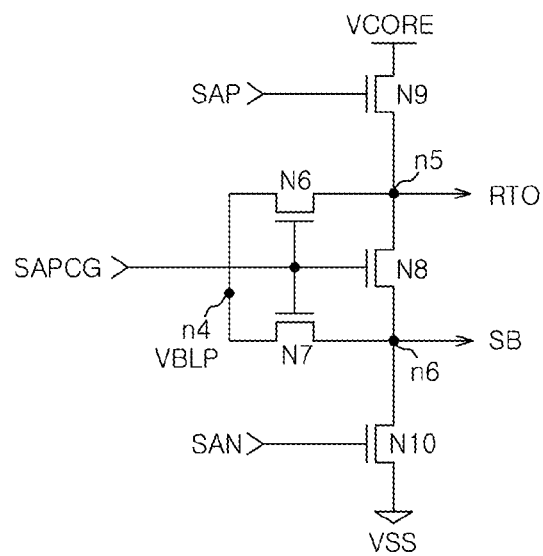
FIG. 3 is a detailed circuit diagram of a sense amplifier control circuit.

A circuit diagram of a sense amplifier control circuit is described below with reference to FIG. 3.

The sense amplifier control circuit includes a sixth NMOS transistor N6 connected between a fourth node n4 and a fifth node n5 and configured to receive a control signal SAPCG, a seventh NMOS transistor N7 connected between the fourth node n4 and a sixth node n6 and configured to receive the control signal SAPCG, an eighth NMOS transistor N8 connected between the fifth node n5 and the sixth node n6 and configured to receive the control signal SAPCG, a ninth NMOS transistor N9 connected between a core voltage VCORE and the fifth node n5 and configured to output a sense amplifier power voltage RTO to the fifth node in response to a first power source supply signal SAP, and a tenth NMOS transistor connected between the sixth node n6 and a ground voltage VSS and configured to pull down a voltage of the sixth node n6 in the direction of the ground voltage VSS in response to a second power source supply signal SAN.

The operation of the sense amplifier control circuit is described below with reference to FIG. 3.

When charge sharing occurs between a bit line BL and a bit bar line BLb, the BLSA starts an active operation, which then shifts the control signal SAPCG to a low level by a signal internally generated in response to an external command, which then shifts the first and second power source supply signals SAP and SAN to a high level.

Before the BLSA starts the active operation, the control signal SAPCG of a high level and the first and second power source supply signals SAP and SAN of a low level are supplied to the sense amplifier control circuit. The sense amplifier control circuit turns on the sixth to eighth NMOS transistors N6, N7, N8 in response to the control signal SAPCG of a high level and turns off the ninth and the tenth NMOS transistors N9 and N10 in response to the first and second power source supply signals SAP and SAN of a low level so that the sense amplifier power voltage RTO and the sense amplifier ground voltage SB maintain a precharge voltage VBLP.

When the BLSA starts the active operation, the low level control signal SAPCG and the high level first and second power source supply signals SAP and SAN are supplied to the sense amplifier control circuit, which turns off the sixth to eighth NMOS transistors N6, N7, N8 in response to the low level control signal SAPCG and turns on the ninth and the tenth NMOS transistors N9 and N10 in response to the high level first and second power source supply signals SAP and SAN, which results in the separation of the sense amplifier power voltage RTO and the sense amplifier ground voltage SB between which a voltage difference is generated. Accordingly, the generated voltage difference is outputted from the sense amplifier control circuit. The sense amplifier power voltage RTO has a level substantially equal to the core voltage VCORE, and the sense amplifier ground voltage SB has a level substantially equal to the ground voltage VSS.

Figure 4:
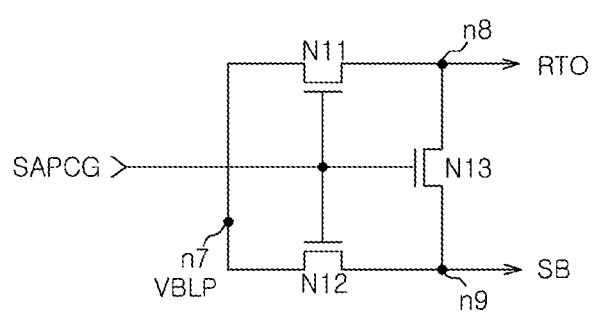
FIG. 4 is a detailed circuit diagram of a sense amplifier control circuit according to an embodiment of the present invention.

FIG. 4 is a detailed circuit diagram of a sense amplifier control circuit according to an embodiment of the present invention.

The sense amplifier control circuit according to an embodiment of the present invention is described below with reference to FIG. 4.

The sense amplifier control circuit according to an embodiment of the present invention includes an $11^{th}$ NMOS transistor N11 connected between a seventh node n7 and an eighth node n8 and configured to receive a control signal SAPCG, a $12^{th}$ NMOS transistor N12 connected between the seventh node n7 and a ninth node n9 and configured to receive the control signal SAPCG, and a 13th NMOS transistor N13 connected between the eighth node n8 and the ninth node n9 and configured to receive the control signal SAPCG.

The operation of the sense amplifier control circuit according to an embodiment of the present invention is described below with reference to FIG. 4.

When charge sharing occurs between a bit line BL and a bit bar line BLb, the BLSA starts an active operation, and the control signal SAPCG is enabled in response to a signal internally generated in response to an external command.

Before the BLSA starts the active operation, the control signal SAPCG is enabled and supplied to the sense amplifier control circuit, which turns on the 11th to 13th NMOS transistors N11, N12, N13 in response to the enabled control signal SAPCG so that a sense amplifier power voltage RTO and a sense amplifier ground voltage SB maintain a level substantially equal to a precharge voltage VBLP.

When the BLSA starts the active operation, the control signal SAPCG is disabled and supplied to the sense amplifier control circuit. The sense amplifier control circuit turns off the 11th to 13th NMOS transistors N11, N12, N13 in response to the disabled control signal SAPCG.

Figure 5:
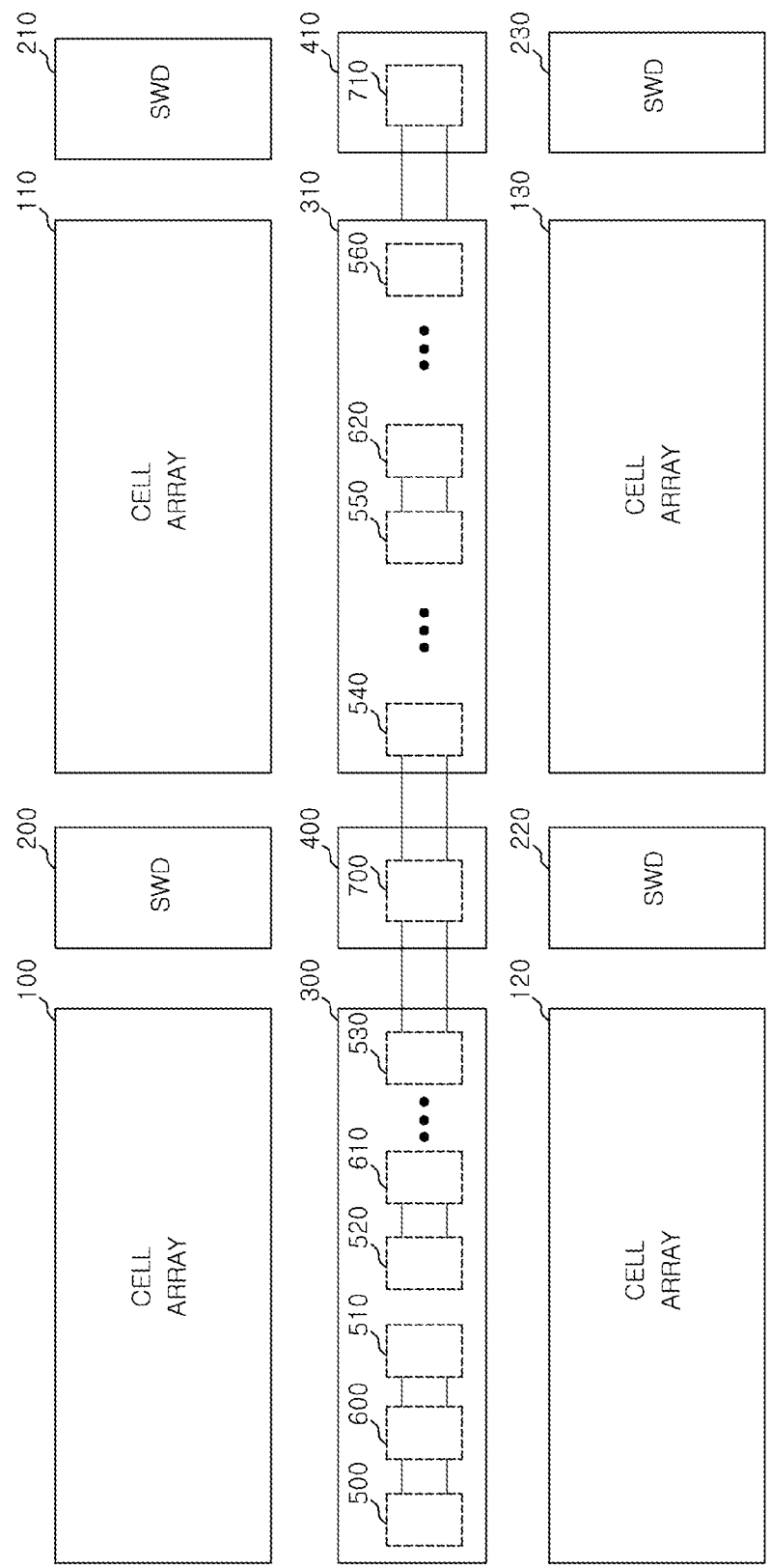
FIG. 5 shows the structure of a semiconductor memory device according to an embodiment of the present invention.

FIG. 5 shows the structure of a semiconductor memory device according to an embodiment of the present invention.

The structure of the semiconductor memory device according to an embodiment of the present invention is described below with reference to FIG. 5.

The semiconductor memory device according to an embodiment of the present invention includes a plurality of cell arrays 100~430, a plurality of SWD arrays 200, 210, 220, and 230, a plurality of BLSA arrays 300 and 310, and a plurality of sub-holes 400 and 410.

Each of the plurality of cell arrays 100, 110, 120, and 130 includes a plurality of cells to store data. Two of the cell arrays 100, 110, 120, and 130 placed in one direction (for example, in a vertical direction) share one of the plurality of BLSA arrays 300 and 310. For example, as shown in FIG. 5, two cell arrays 100, 120 may be disposed vertically with respect to each other, and the BLSA array 300 is disposed in between the cell arrays 100, 120. The BLSA arrays such as 300, 310 may be disposed, for example, along a horizontal direction. The BLSA arrays 300 and 310 include a plurality of BLSAs 500, 510, 520, 530, 540, 550, and 560 and a plurality of sense amplifier control circuits 600, 610, and 620 to amplify a voltage difference between a bit line BL and a bit bar line BLb. The regions of cell arrays placed in one direction (for example, left and right or a horizontal direction) from among the cell arrays 100~130 share one of the SWD arrays 200~230 disposed in another direction (for example, a vertical direction). The SWD arrays 200, 210, 220, and 230 include a plurality of word line drivers to selectively drive the plurality of cell arrays 100, 110, 120, and 130 when an address is received.

The sub-holes 400 and 410 are placed in respective regions where BLSA arrays horizontally disposed between upper and lower cell arrays cross the SWD arrays 200, 210, 220, and 230 vertically disposed between left and right cell arrays. In an embodiment of the present invention, the plurality of sub-holes 400 and 410 include respective sense amplifier control circuits 700 and 710.

Figure 1:
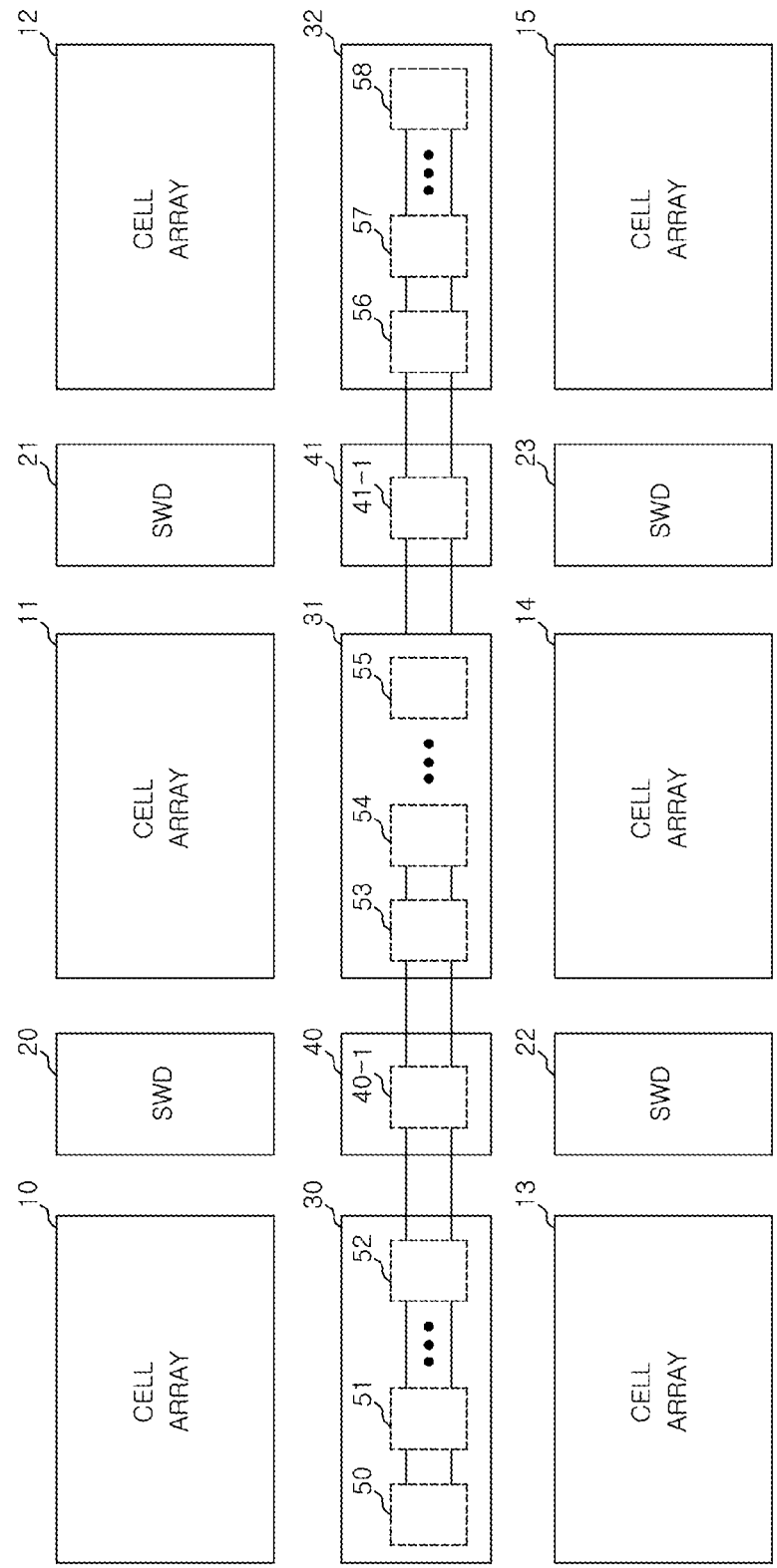
FIG. 1 shows the structure of a known semiconductor memory device.

The known semiconductor memory device and the semiconductor memory device according to the embodiment of the present invention are compared with each other with reference to FIGS. 1 and 5.

The semiconductor memory device according to an embodiment of the present invention includes the sense amplifier control circuits 700 and 710 in the respective sub-holes 400 and 410 and the sense amplifier control circuits 600 to 620 in the respective BLSA arrays 300 and 310.

The known semiconductor memory device does not include a sense amplifier control circuit in a BLSA array, but it includes one that is disposed in a sub-hole. The resulting increase in the length of lines to couple the BLSA array and the sense amplifier control circuit generates noise in the precharge voltage VBLP supplied from the sense amplifier control circuit. In FIG. 1 for example, in the plurality of BLSAs 50, 51, 52, 53, and 54 connected to the sense amplifier control circuit 40~1, the length of lines from the BLSA 50 to the sense amplifier control circuit 40~1 is greater than the length of lines from the BLSA 52 to the sense amplifier control circuit 40~1, which will likely result in a noise at BLSA 50 as it is farther.

The semiconductor memory device according to an embodiment of the present invention includes sense amplifier control circuits in a sub-hole and a BLSA array. For example, in FIG. 5, in the plurality of BLSAs 500, 510, 520, and 530 included in the BLSA array 300, the BLSA 530 is connected to the sense amplifier control circuit 700 disposed in the sub-hole 400. The BLSAs 500 and 510 that are farther from the sense amplifier control circuit 700 disposed in the sub-hole 400 are connected to the sense amplifier control circuit 600 included in the BLSA array 300. In another embodiment of the present invention, the BLSA array 310 includes the plurality of BLSAs 540, 550, and 560 and the sense amplifier control circuit 620.

In an embodiment of the present invention, the sense amplifier control circuit 600 included in the BLSA array 300 is connected to the plurality of BLSAs 500 and 510. Furthermore, the sense amplifier control circuit 610 included in the BLSA array 300 is connected to the BLSA 520.

In an embodiment of the present invention, the sense amplifier control circuits 700 and 710 included in the respective sub-holes 400 and 410 may be sense amplifier control circuits. The sense amplifier control circuits 600, 610, and 620 included in the BLSA arrays may be sense amplifier control circuits according to an embodiment of the present invention.

When the control signal SAPCG is enabled, the BLSAs 500, 510, 520, and 550 connected to the respective sense amplifier control circuits 600, 610, and 620 directly receive the precharge voltage VBLP from the sense amplifier control circuits 600, 610, and 620.

In contrast, when the control signal SAPCG is disabled, the sense amplifier control circuits 600, 610, and 620 are turned off. At this moment, the BLSAs 500, 510, 520, and 550 connected to the sense amplifier control circuits 600, 610, and 620 receive the sense amplifier power voltage RTO and the sense amplifier ground voltage SB from the power supply devices of the BLSA arrays 300 and 310 and amplify a voltage difference between the bit line and the bit bar line BLb.

While certain embodiments have been described above, it will be understood to those skilled in the art that the embodiments described are by way of example only. Accordingly, the circuit and device including the same according to the present invention described herein should not be limited based on the described embodiments. Rather, the circuit and device described herein should only be limited in light of the claims that follow when taken in conjunction with the above description and accompanying drawings.

What is claimed is:

1. A sense amplifier control circuit disposed in a bit line sense amplifier (BLSA) array region including a plurality of BLSAs and configured to supply a precharge voltage to the plurality of BLSAs in response to a control signal, wherein the BLSA array region is disposed between a pair of cell array regions.

2. The sense amplifier control circuit according to claim 1, wherein the sense amplifier control circuit outputs the precharge voltage in response to the control signal enabled, before the plurality of BLSAs starts an active operation.

3. The sense amplifier control circuit according to claim 1, wherein the sense amplifier control circuit is connected to one or more of the plurality of BLSAs.

4. The sense amplifier control circuit according to claim 1, wherein the plurality of BLSAs is configured to comprise respective sense amplifier latches and supply the precharge voltage to the sense amplifier latches.

5. A semiconductor memory device, comprising:
- a bit line sense amplifier (BLSA) array configured to comprise one or more first sense amplifier control circuits to supply a precharge voltage to a plurality of BLSAs in response to a control signal; and
- a sub-hole configured to comprise a second sense amplifier control circuit to supply the plurality of BLSAs with the precharge voltage, a sense amplifier power voltage of a core voltage level, and a sense amplifier ground voltage of a ground voltage level in response to the control signal and first and second power source supply signals, wherein the BLSA array is disposed between a pair of cell array regions.

6. The semiconductor memory device according to claim 5, wherein the first sense amplifier control circuit is connected to one or more of the plurality of BLSAs.

7. The semiconductor memory device according to claim 5, wherein the second sense amplifier control circuit is connected to one or more of the plurality of BLSAs.

8. The semiconductor memory device according to claim 6, wherein the first sense amplifier control circuit outputs the precharge voltage in response to the control signal enabled, before the plurality of BLSAs starts an active operation.

9. The semiconductor memory device according to claim 5, wherein:
- the plurality of BLSAs comprise respective sense amplifier latches, and
- the first sense amplifier control circuit supplies the precharge voltage to the sense amplifier latches.

10. The semiconductor memory device according to claim 5, wherein:
- the plurality of BLSAs comprise respective sense amplifier latches, and
- the second sense amplifier control circuit supplies the precharge voltage, the sense amplifier power voltage, and the sense amplifier ground voltage to the sense amplifier latches in response to the control signal.

11. The semiconductor memory device according to claim 5, wherein the first sense amplifier control circuit supplies the precharge voltage to BLSAs adjacent to each other, from among the BLSAs within the bit line sense amplifier array.

12. The semiconductor memory device according to claim 5, wherein the second sense amplifier control circuit supplies the precharge voltage, the sense amplifier power voltage, and the sense amplifier ground voltage to BLSAs adjacent to each other, from among the BLSAs within the sub-hole.

* * * * *